United States Patent [19]

Sabo

[11] Patent Number: 4,833,460
[45] Date of Patent: May 23, 1989

[54] PHASING INDICATOR

[76] Inventor: Thomas E. Sabo, 6062 Heatherwood Dr., Alexandria, Va. 22310

[21] Appl. No.: 10,000

[22] Filed: Feb. 2, 1987

[51] Int. Cl.$^4$ ............................................. G08B 21/00
[52] U.S. Cl. .................................... 340/658; 340/663; 361/76; 361/77; 361/85; 324/521; 324/556; 307/514
[58] Field of Search ............... 340/648, 658, 663, 662, 340/661, 644, 645; 307/319, 441, 514, 525, 527, 528; 322/7, 8, 20, 25, 27, 29; 361/30, 31, 76, 85, 87, 92, 77; 324/142, 512, 521, 522, 555, 556, 133

[56] References Cited

U.S. PATENT DOCUMENTS

| | | | |
|---|---|---|---|
| 1,816,729 | 7/1931 | Grassot . | |
| 2,242,956 | 5/1941 | Knapp | 324/522 |
| 2,431,794 | 12/1947 | Dichter | 324/521 |
| 3,156,868 | 11/1964 | Murrills . | |
| 3,243,796 | 3/1966 | Harmon et al. . | |
| 3,626,281 | 7/1969 | Souillard et al. | 324/521 |
| 3,648,112 | 3/1972 | Beckwith | 317/27 R |
| 3,778,801 | 11/1973 | Nudelmont | 340/253 R |
| 3,783,341 | 1/1974 | Beckwith | 317/27 R |
| 3,944,891 | 3/1976 | McDonald et al. | 317/48 |
| 4,021,703 | 3/1977 | Gary et al. | 361/85 |
| 4,196,378 | 4/1980 | Shirai | 318/438 |
| 4,199,798 | 4/1980 | Leppke et al. | 361/76 |
| 4,327,391 | 4/1982 | Grzebielski | 361/31 |
| 4,333,119 | 6/1982 | Schoenmeyr | 361/76 |
| 4,344,027 | 8/1982 | Kalicek | 322/7 |
| 4,363,065 | 12/1982 | Hasegawa et al. | 361/85 |
| 4,366,474 | 12/1982 | Loewenstein | 340/658 |
| 4,381,531 | 4/1983 | Eisenhauer | 361/87 |
| 4,406,984 | 9/1983 | Karlicek | 322/27 |
| 4,423,374 | 12/1983 | Hansen, Jr. | 324/86 |
| 4,461,986 | 7/1984 | Maynard et al. | 318/778 |
| 4,480,221 | 10/1984 | Shozima | 324/96 |
| 4,542,433 | 7/1985 | Schaefer et al. | 361/92 |

FOREIGN PATENT DOCUMENTS

| 789826 | 9/1978 | U.S.S.R. | 324/512 |
|---|---|---|---|
| 876415 | 8/1961 | United Kingdom | 340/658 |

OTHER PUBLICATIONS

"American Nat. Standard Test Proc. for Low-Voltage AC Power Cir. Protectors Used in Enclosures", ANSI, 10/1/74.
"Symmetrical Components", by Wagner & Evans, Robert E. Krieger Publishing Co., 1982 (Reprint), 1933 (Original).
"Heavy Duty Network Protectors Type CM-22", Westinghouse Elec. Corp., Switchgear Division, pp. 5-12, May 1967.

Primary Examiner—Donald J. Yusko
Assistant Examiner—Tyrone Queen
Attorney, Agent, or Firm—E. Barron Batchelder

[57] ABSTRACT

An apparatus for visually indicating abnormal phase relationships between incoming or outgoing phases for a plural phase device, comprised of a plurality of light emitting means interconnected between phases by a logic circuit arrangement whereby the various combinations of on/off indicators present a coded, visual presentation representing the specific mismatch condition of the network. The invention encompasses the concept of incorporating the indicating circuitry within the multiple phase device enclosure and providing an aperture in the enclosure so that the indicators may be viewed without the necessity of gaining access to the interior of the device and exposing individuals to the danger of high voltage/current circuits.

20 Claims, 4 Drawing Sheets

PHASING INDICATOR

FIELD OF THE INVENTION

This invention relates to a device for monitoring phase mismatch at the input or output of a plural phase device.

BACKGROUND OF THE INVENTION

Commercial distribution of electrical power is accomplished through multiphase AC networks which, in the United States, have been standardized as three phase networks. The economical distribution and extraction of powr from these networks relies upon proper phase matching between the lines.

Numerous safety devices have been developed which sense faults as a phase mismatch function and automatically open the network circuits. These devices are commonly referred to as network protectors which automatically disconnect elements associated with the network upon occurrence of a malfunction. The malfunction causing the automatic disconnect may be the result of or indicated by a phase mismatch between lines and the classical maintenance approach to determining the existence of such mismatches is for a maintenance person to enter the danger zone around the high voltage/current network protector. This zone is generally in a ground cavity where water buildup around the protector is inevitable or in a fenced area located outside so that typically maintenance personnel will be standing in a puddle of water or an another highly conductive surface while checking the system. Being thus precariously exposed, maintenance personnel must open the network protector case and measure the differences between phases by holding test prods at various points within the device, an action which requires placing hands in dangerous proximity to the high voltage/current lines.

Numerous attepmts have been made to create phasing or status indicators for power distribution systems but they are generally complex devices lacking reliability without fail-safe redundancies and in many instances require maintenance personnel to open the protective casings with greater frequency than with another device. For instance, J. Nudelmont, U.S. Pat. No. 3,778,801 on "Apparatus For Indicating Voltage Presence, Phase Sequence, Voltage Magnitude, Ground Faults, Etc. In An Electrical Power Distribution System" issued Dec. 11, 1973 discloses a monitoring circuit capable of indicating phase mismatch through indicator lamps. However, there is no redundancy within the circuit so an operator is not sure whether or not a mismatch indication is a fault within the network or test system. Furthermore, the reference fails to teach the concept of incorporating the circuitry within existing network protectors due to the complexity of the circuitry and the requirement for operator interaction with the test system which would necessitate opening the equipment case to manipulate the various control systems required to perform a test.

W. Murrills, U.S. Pat. No. 3,156,868 on "Phase Sequence Indicator Including Double Throw Switching Means" issued Nov. 10, 1964 is another example of utilizing lamp means to determine phase relationship between lines. Note that this system also requires manual switchingn operations to be performed by maintenance personnel and lacks fail-safe redundancy.

Phase related tests are required for maintenance troubleshooting and for verification of proper line connection before hinging a section of the network on line after maintenance or initial installation. The necessity for performing such tests on the high voltage/current lines is one of the primary factors leading to a relatively high mortality rate due to job oriented accidents for power distribution network maintenance personnel.

OBJECTIVES OF THE INVENTION

In consideration of the obvious hazards to power distribution network maintenance personnel, a primary objective of this invention is to provide an indicating device whereby maintenance personnel may visually ascertain the existence of phase mismatches at the input or output of a multiphase device without exposing themselves to the potential dangers of high voltage/current distribution lines.

Another objective of the present invention is to provide an indicating means for the relative phase status between individual phase distribution lines in a network.

Another objective of the present invention is to provide an indicating means for the open phase status of individual phase distribution lines in a network.

Another object is to provide a plurlaity of visual indicators electronically interconnected to the distribution circuits according to a logic pattern to provide indications which may be interpreted according to a logic truth table to reveal the relative status between individual phase lines of the network.

Another objective is to provide a plurality of visual indicators electronically interconnected to the distribution circuits according to a logic pattern to provide indications which may be interpreted according to a logic truth table to reveal the status of individual phase lines of the network.

A still further objective of the present invention is to provide a compact, small indicating circuit capable of being placed within a multiphase device container which will provide a fail-safe indication of proper operation or malfunction through logically innteracting indicator redundancy.

Another objective of the present invention is to provide a phase mismatch indicating device readily adapted for installation within network protector casings and which utilizes low voltage circuitry to minimize hazards to maintenance personnel servicing the test system.

A still further objective of the present invention is to provide a window in a multiphase device container to permit an operator to view a plurality of light emitting devices within the container that are driven according to a logic scheme to present an interpretable indication of the relative status of the phase conductors.

Another objective of the present invention is to provide an indicating logic visual display in which phase mismatch is represented by extinguishing indicator lamps.

A further objective of the present invention is to provide a logic display for indicating the relative phase matching status between a plurality of individual phase conductors in a network wherein all the indicator lamps are off under normal operating conditions and one or more lamps become illuminated during abnormal conditions with the lamps in the off status serving to indicate the mismatch.

A still further objective of the present invention is to provide a simple circuit for accomplishing the above objectives which is both economical to produce and which may readily be adapted to existing multiphase devices such as network protectors by field personnel.

SUMMARY OF THE INVENTION

The present invention consists of a plurality of indicating lamps electronically interconnected between the various phases of a multiphase distribution network in a manner such that phase unbalance between various individual conductors will cause the related indicator to be extinguished. The logic interconnection circuitry of the plurality of indicators is arranged so that an operator may determine phase mismatch between the individual phase conductors in the network, including a complete absence of a phase.

The indicating circuitry is comprised of components arranged so they can be placed within the protective casing of the multiphase device they are associated with and a window or lens equipped peephole is provided in the device casing to allow maintenance personnel to view the individual indicators without the necessity of opening the casing and exposing themselves to the high current conductors.

BRIEF DESRIPTION OF THE DRAWINGS

DESCRIPTION OF THE PREFERRED EMBODIMENT

Figure 1:
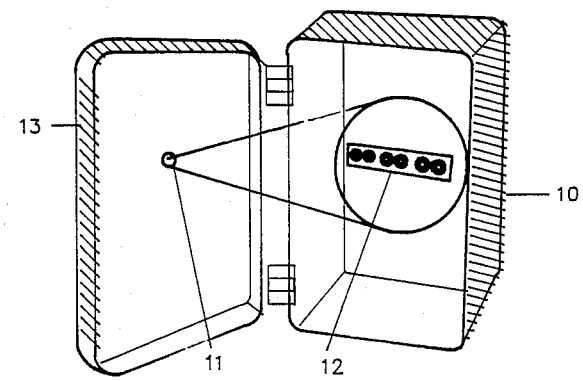
FIG. 1 is a front 3/4 view of a typical network protector in a submersible enclosure indicating the placement of the logic indicator arrays within the circuitry and the relative placement of the viewing peephole in the enclosure casing.
Figure 2:
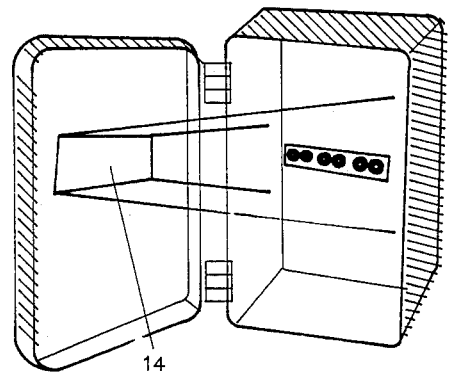
FIG. 2 is a front view of a typical network protector in a submersible enclosure indicating the placement of the logic indicator arrays within the circuitry and the relative placement of the rectangular window in the enclosure casing.

FIG. 1 illustrates the invention installed in a typical distribution line network protector contained within a submersible enclosure 10. A peephole, 11, including a lens, is located in the enclosure cover 13. The peephole lens provides the field of view within the enclosure indicated by the dashed lines in FIG. 1 to permit easy viewing of the indicator lamps 12. Some enclosures incorporate a window, 14, as illustrated in FIG. 2.

The logic display of the invention is provided by indicating lamp array 12. It is placed anywhere within the viewing zone indicated in FIGS. 1 and 2 so that it may be monitored by maintenance personnel. The indicating lamp array 12 combined with the viewing aperture 11 provide a fail-safe means to visually determine the status of the phase relationship of the network lines without opening the enclosure 10.

Figure 3:
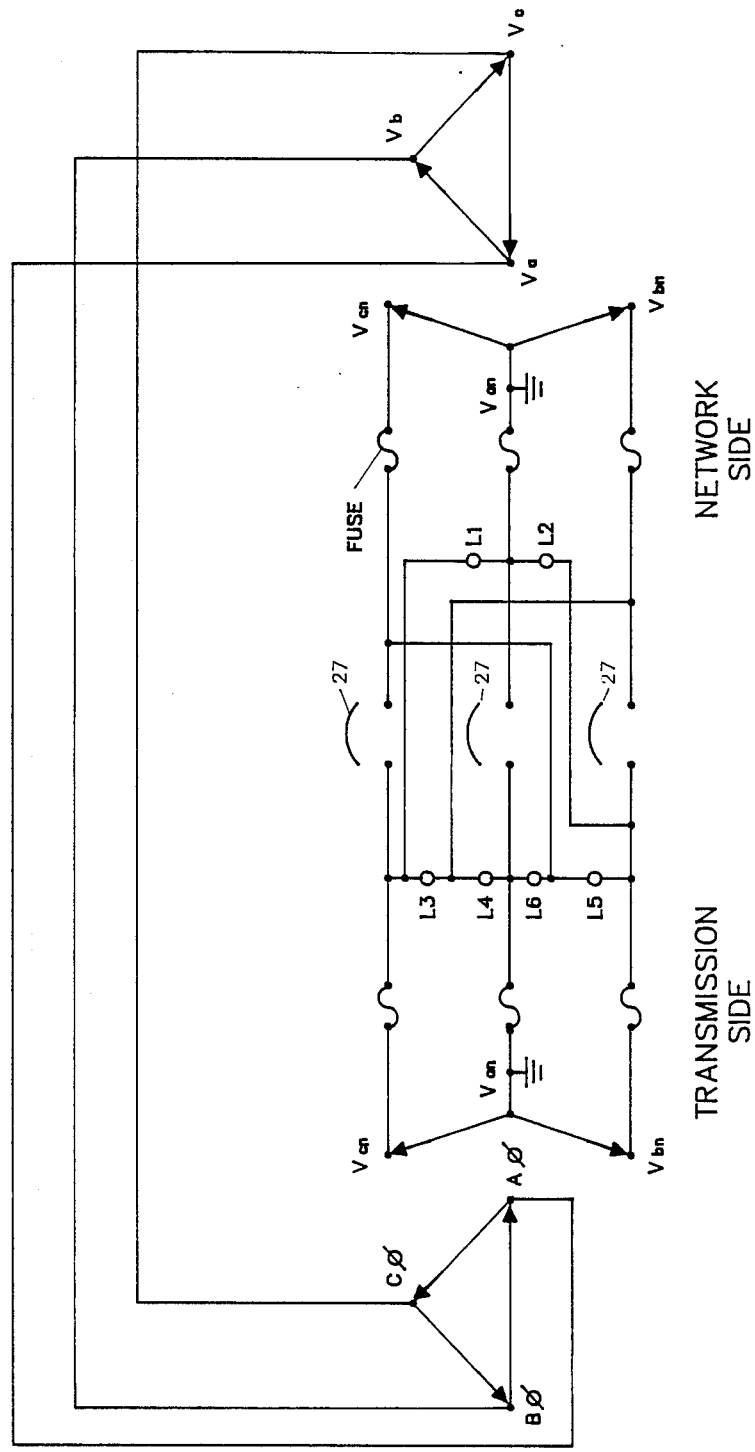
FIG. 3 is a simplified schematic of the electrical interconnection of the invention in a typical distribution network.

The invention is electrically installed in a typical distribution network as illustrated schematically in FIG. 3 where indicators L1 through L6 are cross connected between phase lines in a parallel relationship to the network protector contacts 27. In FIG. 3, indicators L1 through L6 correspond to L1 through L6 of FIGS. 4 and 5 and the network protector contacts 27 correspond to 27 of FIG. 4.

Figure 4:
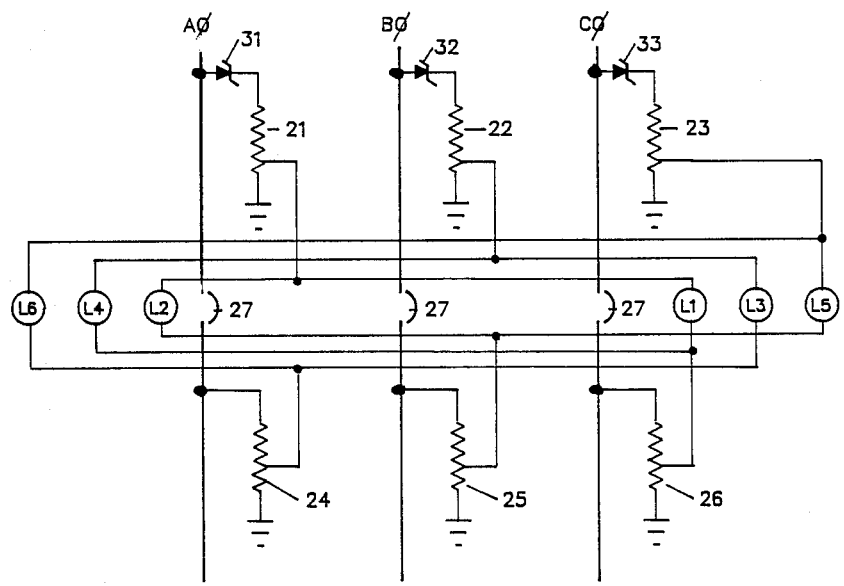
FIG. 4 is a simplified schematic and related logic truth table indicating the relationship between the display logic and circuit interconnections.

FIG. 4 depicts a simplified schematic for a three phase application of the invention combined with the logic truth table realized through the interconnection depicted in the schematic. Six indicating means, identified as L1 through L6 are connected to the distribution lines A0, B0 and C0 through voltage attenuation means 21 through 26. These resistive networks permit the use of economical, low voltage circuit elements. Circuit interrupts 27 automatically open the lines A0, B0 and C0 in the event of a malfunction but both sides of the circuit remain hot, i.e. the network and transformer sides, due to parallel distribution features of the total distribution network as illustrated in FIG. 3. Thus when performing the following circuit analysis interrupts 27 may be considered closed, irrespective of their actual status.

The lamps, L1 through L6 are arranged and electrically interconnected so they are on when the phases are properly matched. For instance, L1 and L2 are connected to A0 via a common connection to voltage reduction means 21. The other side of L1 is connected to the C0 line via a common connection with L4 to the voltage reduction means 26. Thus L1 will remain on unless a mismatch occurs between the A and C phases, see the logic table in FIG. 4. In the table, when L1 is off in rows 4 and 5 a possible mismatch is indicated in the A0 column with C0. If a mismatch occurs, the phase angle between the two will not be great enough to cause L1 to be illuminated and thus an indication of this mismatch will be provided.

L2, which shares the common connection with L1 to A0 via 21, shares a common connection with L5 to the B0 line via voltage reduction means 25. Thus L2 will be illuminated as long as a proper phase relationship exists between the A and B phases but it will be extinguished upon a phase mismatch between A and B, see rows 2 and 6 of the A0 column.

Voltage reduction means 22 provides a common connection for indicators L4 and L3 with the B0 line. Thus L4 indicates a mismatch between the B and C phases, see rows 3 and 6 of the B0 column. L3, which is connected between the A and B phase lines by 22 and 24 provides an indication of an improper phase relationship between A0 and B0, see rows 2 and 5 of the B0 column.

L5 and L6 are connected via 23 to the C0 line and L5 is connected to B0 via 25 as previously explained. Thus a mismatch between the C and B phases is indicated by L5 as presented in rows 3 and 5 of the C0 column of the table. L6 is connected to the A0 line via 24 to provide a mismatch indication between the C and A phases as indicated by rows 4 and 6 of the C0 column of the table.

Because the invention operates as a phase angle shift principle, zener diodes 31 through 33 are incorporated in the circuit to compensate for phase reversal on a delta connected transformer primary. This phase reversal results in different phase angle shift between the primary and secondary which is connected to the network protector. The primary reversal on the delta side of a delta-wye transformer is seen by the basic circuitry of the phasing indicator as 125 and 250 volt logic levels. Therefore, zener diodes 31, 32 and 33 are selected to operate at more than 125 volts and less than 250 volts to mask out the phase reversal effects. In the preferred embodiment, 140 volt zener diodes are used.

The preceding lamp functions are summarized by the table in FIG. 4. A detailed analysis of the table will reveal that a mismatch between two phases is indicated when two of the six indicators are off, rows 2, 3 and 4 of the table and plural mismatches are indicated when more than 2 but less than all of the indicators are off, see rows 5 and 6 of the table. This redundancy of indication provides fail-safe operation of the system and enhances the confidence factor. It is desirable for reliability reasons, especially due to the relationship between personnel safety and reliability of circuit status indications.

Figure 5:
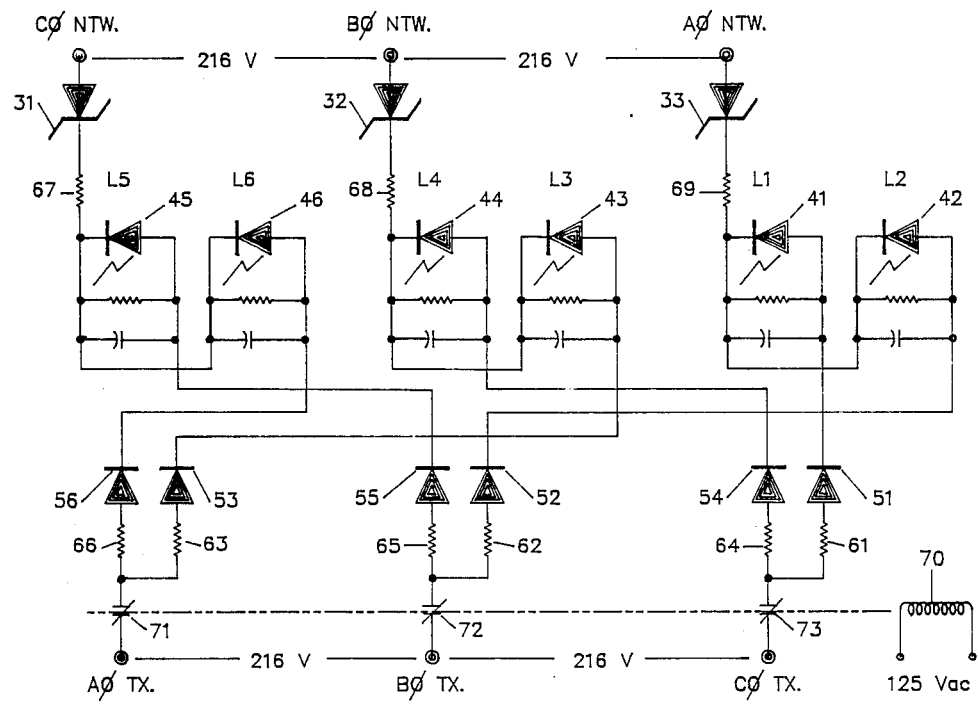
FIG. 5 is a detailed schematic diagram illustrating a preferred embodiment of the present invention utilizing solid state components including light emitting diodes as illumination means.

FIG. 5 is a detailed schematic diagram of a preferred embodiment of the present invention where indicator lamps L1 through L6 are provided by light emitting diodes designated as 41 through 46 which correspond to the L1 through L6 indicator numbers of FIGS. 3 and 4. The L designations are carried forward in FIG. 5 and represent each individual light emitting diode circuit comprised of a light emitting diode and RC filter network typically comprised of a 4.7 k ohm resistor and a 3.3 $\mu f$ capacitor.

In FIG. 5, NTW signifies the network side of the protector and TX the transformer side. Rectifiers 51 through 56 provide halfwave rectification of the alternating current between phases to provide the required DC energizing potential for the light emitting diodes.

In a typical installation, the voltage in the network is 480-216 volts phase-to-phase and 125 volts phase to ground. This is reduced by resistors 61 through 69 to a safe operating range for the rectifiers, light emitting diodes and components selected.

Relay 70 is energized by an alternating voltage derived from the network protector to cause normally closed contacts 71 through 73 to be in an open condition as long as all three phases are operating satisfactorily. When a malfunction occurs, the network protector opens and relay 70 is deenergized, closing contacts 71 through 73 and providing an electrical connection for the LED driving rectifiers 51 through 56 to their respective phase lines. The invention may be used in conjunction with network protectors of the type which uses single-pole, double-throw relay contact sets for line interrupters. In such instances, the normally closed contact pairs may be used as relay contact sets 71 through 73 of FIG. 5 as available. (The normally open contact sets are used as the network interrupters.)

Systems which use line interrupters on less than all lines may be adapted according to the invention so that the normally closed contact sets for the protected lines are used with an auxiliary relay to provide operation on the unprotected lines.

While preferred embodiments of this invention have been illustrated and described, variations and modifications may be apparent to those skilled in the art. Therefore, I do not wish to be limited thereto and ask that the scope and breadth of this invention be determined from the claims which follow rather than the above description.

What I claim is:

1. An apparatus for presenting a logic display indicating phase mismatch in a multiphase network, comprising:

threshold means connected to each phase of said network for permitting a current flow between phases when the interphase voltage exceeds a significant fraction of the voltage of any phase;

a first means for indicating current flow from a first phase conductor to a second phase conductor;

a second means for indicating current flow from said first phase conductor to a third phase conductor;

a third means for indicating current flow from said second phase conductor to said first phase conductor;

a fourth means for indicating current flow from said second phase conductor to said third phase conductor;

a fifth means for indicating current flow from said third phase conductor to said first phase conductor; and a sixth means for indicating current flow from said third phase conductor to said second phase conductor.

2. An apparatus as defined in claim 1, wherein said apparatus comprises a fault responsive switching means, further comprising switching means for enabling said first, second, third, fourth, fifth and sixth indicating means.

3. An apparatus as defined in claim 1, further comprising:

a fault responsive switching means for connecting said first phase conductor to said first and second indicating means, said second phase conductor to said third and fourth indicating means, and said third phase conductor to said fifth and sixth indicating means.

4. An apparatus as defined in claim 1, wherein said threshold means comprises:

a first zener diode connecting said first phase conductor to said first and second indicating means;

a second zener diode connecting said second phase conductor to said third and fourth indicating means; and a third zener diode connecting said third phase conductor to said fifth and sixth indicating means.

5. An apparatus as defined in claim 1 wherein each of indicating means comprise:

a voltage reduction means;

a rectifier; and a light emitting diode.

6. An apparatus as defined in claim 3 wherein said fault responsive switching means include relay contacts operated by a network protector.

7. An apparatus as defined in claim 6 wherein said relay contacts are normally closed contacts held open by a network protector when said network protector is in an untripped state.

8. An apparatus as defined in claim 4 wherein said network includes:

a delta-wye transformer interconnection s subject to delta-wye phase mismatch induced interface potential differences; and said zener diodes have an operational threshold above the voltage range of the delta-wye phase mismatch induced interphase potential differences.

9. An apparatus for presenting a logic display indicating phase mismatch in a multiphase network, comprising: threshold means connected to each phase of said network for permitting a current flow between phases when the interphase voltage exceeds a significant fraction of the voltage of any phase;

a first means for indicating current flow from the transformer side of a network protector for a first phase conductor to the network side of a network protector for a second phase conductor;

a second means for indicating current flow from the transformer side of said network protector for said first phase conductor to the network side of a network protector for a third phase conductor;

a third means for indicating current flow from the transformer side of said network protector for said second phase conductor to the network side of said network protector for said first phase conductor;

a fourth means for indicating current flow from the transformer side of said network protector for said second phase conductor to the network side of said network protector for said third phase conductor;

a fifth means for indicating current flow from the transformer side of said network protector for said third phase conductor to the network side of said network protector for said first phase conductor; and a sixth means for indicating current flow from the transformer side of said network protector for said third phase conductor to the network side of said network protector for said second phase conductor.

10. An apparatus as defined in claim 9, wherein said apparatus comprises a fault responsive switching means further comprising switching means for energizing said first, second, third, fourth, fifth and sixth indicating means.

11. An apparatus as defined in claim 9, further comprising:
a fault responsive switching means for connecting said first phase conductor to said first and second indicating means, said second phase conductor to said third and fourth indicating means, and said third phase conductor to said fifth and sixth indicating means.

12. An apparatus as defined in claim 9, wherein said threshold means comprises:
a first zener diode connecting said first phase conductor to said first and second indicating means;
a second zener diode connecting said second phase conductor to said third and fourth indicating means; and
a third zener diode connecting said third phase conductor to said fifth and sixth indicating means.

13. An apparatus as defined in claim 11 wherein said fault responsive switching means include relay contacts operated by said network protectors.

14. An apparatus as defined in claim 13 wherein said relay contacts are normally closed contacts held open by said network protectors when they are in an untripped state.

15. An apparatus as defined in claim 12 wherein said network includes:
a delta-wye transformer interconnection s subject to delta-wye phase mismatch induced interface potential differences; and
said zener diodes are selected to operate above the voltage range of the delta-wye phase mismatch induced interphase potential differences.

16. An apparatus as defined in claim 9, wherein each of said indicating means comprise:
a voltage reduction means;
a rectifier; and
a light emitting diode.

17. An apparatus for presenting a logic display indicating phase mismatch in a multiphase network, comprising:
a first zener diode having a threshold above the voltage range of said phase mismatch induced interphase potential differences connecting said first phase conductor to a first and a second DC powered indicating circuit means;
a second zener diode having a threshold above the voltage range of said phase mismatch induced interphase potential differences connecting said second phase conductor to a third and a fourth DC powered indicating circuit means;
a third zener diode having a threshold above the voltage range of said phase mismatch induced interphase potential differences connecting said third phase conductor to a fifth and a sixth DC powered indicating circuit means;
said first DC powered indicating circuit means for monitoring current flow from the transformer side of a network protector for a first phase conductor to the network side of a network protector for a second phase conductor connected to said network side via said first zener diode;
said second DC powered indicating circuit means for monitoring current flow from the transformer side of said network protector for said first phase conductor to the network side of a network protector for a third phase conductor connected to said network side via said first zener diode;
said third DC powered indicating circuit means for monitoring current flow from the transformer side of said network protector for said second phase conductor to the network side of said network protector for said first phase conductor connected to said network side via said second zener diode;
said fourth DC powered indicating circuit means for monitoring current flow from the transformer side of said network protector for said second phase conductor to the network side of said network protector for said third phase conductor connected to said network side via said second zener diode;
said fifth DC powered indicating circuit means for monitoring current flow from the transformer side of said network protector for said third phase conductor to the network side of saidi network protector for said first phase conductor connected to said network side via said third zener diode;
said sixth DC powered indicating circuit means for monitoring current flow from the transformer side of said network protector for said third phase conductor to the network side of said network protector for said second phase conductor connected to said network side via said third zener diode; and
a fault responsive switching means for connecting said first phase conductor to said first and second DC powered indicating circuit means, said second phase conductor to said third and fourth DC powered indicating circuit means, and said third phase conductor to said fifth and sixth DC powered indicating circuit means.

18. An apparatus as defined in claim 17 wherein said DC powered indicating circuits each comprises: a voltage reduction means;
a rectifier; and
a light emitting diode.

19. An apparatus as defined in claim 18 wherein said fault responsive switching means include relay contacts operated by said network protectors.

20. An apparatus as defined in claim 19 wherein said relay contacts are normally closed contacts held open by said network protectors when they are in an untripped state.

* * * * *